United States Patent
Tung

(10) Patent No.: US 9,870,994 B2
(45) Date of Patent: Jan. 16, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/489,461

(22) Filed: Sep. 17, 2014

(65) Prior Publication Data

US 2016/0079173 A1  Mar. 17, 2016

(51) Int. Cl.
*H01L 23/532* (2006.01)
*H01L 21/768* (2006.01)
*H01L 21/311* (2006.01)

(52) U.S. Cl.
CPC .. *H01L 23/53238* (2013.01); *H01L 21/31144* (2013.01); *H01L 21/76834* (2013.01); *H01L 21/76849* (2013.01); *H01L 21/76885* (2013.01); *H01L 2924/0002* (2013.01)

(58) Field of Classification Search
CPC . H01L 23/48; H01L 23/53238; H01L 23/528; H01L 21/7684; H01L 21/76877; H01L 21/02167; H01L 21/76843
USPC ........................... 257/762, 751; 438/634, 653
See application file for complete search history.

(56) References Cited

U.S. PATENT DOCUMENTS

| | | | |
|---|---|---|---|
| 6,071,809 A * | 6/2000 | Zhao | H01L 21/7681 257/E21.579 |
| 6,221,775 B1 | 4/2001 | Ference et al. | |
| 6,509,267 B1 * | 1/2003 | Woo | H01L 21/76801 257/E21.576 |
| 6,969,911 B2 | 11/2005 | Abe | |
| 7,253,098 B2 | 8/2007 | Chen et al. | |
| 7,745,324 B1 | 6/2010 | Yang et al. | |
| 7,968,456 B2 | 6/2011 | McLaughlin et al. | |
| 8,446,012 B2 * | 5/2013 | Yu | H01L 21/76826 257/758 |
| 8,598,031 B2 * | 12/2013 | Zhang | H01L 21/31127 257/774 |
| 8,772,938 B2 | 7/2014 | Boyanov et al. | |
| 2002/0182853 A1 | 12/2002 | Chen et al. | |
| 2005/0087871 A1 | 4/2005 | Abe | |
| 2007/0228569 A1 * | 10/2007 | Wang | H01L 21/76819 257/750 |
| 2008/0119047 A1 * | 5/2008 | Yu | H01L 21/76849 438/687 |
| 2008/0197499 A1 * | 8/2008 | Yang | H01L 21/76826 257/758 |

(Continued)

*Primary Examiner* — Peniel M Gumedzoe
*Assistant Examiner* — Christopher Johnson
(74) *Attorney, Agent, or Firm* — Winston Hsu

(57) ABSTRACT

A method for fabricating semiconductor device is disclosed. The method includes the steps of: providing a substrate; forming an ultra low-k (ULK) dielectric layer on the substrate; forming a hard mask on the ULK dielectric layer; forming an opening in the hard mask and the ULK dielectric layer; forming a conductive layer in the opening and on the hard mask; planarizing the conductive layer; and removing the hard mask to expose the ULK dielectric layer so that the top surface of the ULK dielectric layer is lower than the top surface of the conductive layer.

14 Claims, 4 Drawing Sheets

(56) References Cited

U.S. PATENT DOCUMENTS

| | | | |
|---|---|---|---|
| 2010/0044869 A1* | 2/2010 | Zhang | H01L 21/76804 257/773 |
| 2012/0252206 A1 | 10/2012 | Naik et al. | |
| 2012/0267785 A1* | 10/2012 | Oh | H01L 21/76885 257/751 |
| 2014/0057435 A1 | 2/2014 | Zhang et al. | |
| 2014/0159244 A1 | 6/2014 | Lu et al. | |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of preventing damages to low-k dielectric films during fabrication of metal interconnections.

2. Description of the Prior Art

Integrated circuits have evolved into complex devices that can include millions of components (e.g., transistors, capacitors and resistors) on a single chip. The demand for greater circuit density necessitates a reduction in the dimensions of the integrated circuit components, e.g., sub-micron dimensions and the use of various materials to fabricate devices in order to achieve much faster and better electrical performance, such as materials with higher conductivity used in metal lines, materials with lower permittivity (low-k) dielectric constant used as insulating materials, etc. For integrated circuit fabrication, metal interconnects with low resistance, such as copper and aluminum interconnects, provide conductive paths between the integrate circuit components on integrated circuit devices. Generally, metal interconnects are electrically isolated from each other by a dielectric bulk insulating material. At sub-micron dimensions, capacitive coupling potentially occurs between adjacent metal interconnects, which may cause cross talk and/or resistance-capacitance (RC) delay and degrade the overall performance of the integrated circuit.

One method for forming vertical and horizontal interconnects for the integrated circuit components is by a damascene or dual damascene method. Typically, damascene structures have dielectric bulk insulating layers and conductive metal layers, such as low dielectric constant materials and conductive copper layers, stacked on top of one another. Vertical interconnects, i.e., vias, and horizontal interconnects, i.e., trenches are etched into the dielectric bulk insulating layer and the conductive metal layers are subsequently filled into the vias and/or trenches and planarized, such as by a chemical mechanical planarization process (CMP), so that the conducting metal materials are only left in the vias and/or trenches. In the damascene approach, a rather complex dielectric film stack that includes a sequence of hard mask, low-k dielectrics, and etch stop layers, etc., may be required. To obtain such a stack, via/trench lithography, patterning, and wet cleanings are typically required before filing the vias and the trenches with the conductive metal materials.

However, low-k materials of the damascene structure are susceptible to various damages during subsequent processing steps, such as etching, wet-cleaning, pre-metal cleaning, or CMP etc. Such damages can severely increase the dielectric constant of the low-k materials, causing the overall dielectric constant of the resulting dielectric film stack to increase. Therefore, there is a need for a process of making damascene structures with zero or minimized damages to low-k materials in the dielectric film stack.

SUMMARY OF THE INVENTION

According to a preferred embodiment of the present invention, a method for fabricating semiconductor device is disclosed. The method includes the steps of: providing a substrate; forming an ultra low-k (ULK) dielectric layer on the substrate; forming a hard mask on the ULK dielectric layer; forming an opening in the hard mask and the ULK dielectric layer; forming a conductive layer in the opening and on the hard mask; planarizing the conductive layer; and removing the hard mask to expose the ULK dielectric layer so that the top surface of the ULK dielectric layer is lower than the top surface of the conductive layer.

According to another aspect of the present invention, a semiconductor device is disclosed. The semiconductor device includes: a substrate; an ULK dielectric layer on the substrate; a conductive layer embedded in the ULK dielectric layer, wherein the top surface of the ULK dielectric layer is lower than the top surface of the conductive layer; and a cap layer on the conductive layer while contacting the ULK dielectric layer directly, in which the top surface of the cap layer on the ULK dielectric layer is higher than the top surface of the conductive layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
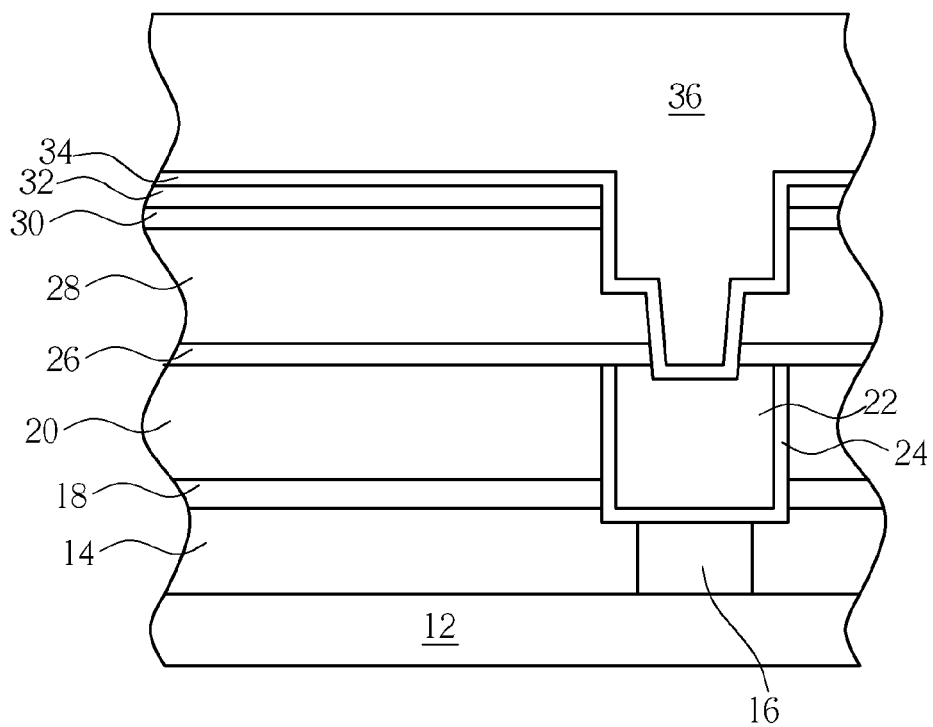
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12 is provided, in which the substrate 12 could be composed of monocrystalline silicon, gallium arsenide (GaAs) or other known semiconductor material. The substrate 12 could also include fin-shaped structures and shallow trench isolation structures (STIs) surrounding the fin-shaped structures. A standard metal-oxide semiconductor (MOS) transistor fabrication could be performed to form at least one MOS transistor (not shown) or other semiconductor devices on the substrate, in which the MOS transistor could be a PMOS transistor, NMOS transistor, or CMOS transistor, and the MOS transistor could also include typical transistor structures including metal gate, spacer, source/drain regions, epitaxial layers, and/or silicides.

After forming the MOS transistor on the substrate 12, an interlayer dielectric (ILD) layer 14 is covered on the substrate 12 and the MOS transistor, a contact plug 16 is formed in the ILD 14 layer, and an a plurality of dielectric layers and metal interconnections are formed atop the ILD layer. In this embodiment, a cap layer 18 such as an organic dielectric coating (ODC) and an ultra low-k (ULK) dielectric layer 20 are formed on the ILD layer 14, and a trench conductor 22 with barrier layer 24 around is formed in the cap layer 18 and ULK dielectric layer 20 through typical metal interconnective or damascene processes.

Another cap layer 26 such as a nitrogen-doped carbon (NDC) material layer, another ULK dielectric layer 28, a hard mask 30 and another hard mask such as a metal layer 32 are formed on the ULK dielectric layer 20 thereafter, and a damascene process could be carried out to first remove part of metal layer 32, part of the hard mask 30, part of the ULK dielectric layer 28, and part of the cap layer 26 for forming an opening (not shown), and a barrier layer 34 and a conductive layer 36 are deposited in the opening. Preferably, the thickness of the hard mask 30 is preferably between 20-150 Angstroms, the hard mask 30 is composed of SiON, the metal layer 32 is composed of TiN, the barrier layer 34 is composed of Ta, Ti, TaN, or TiN, and the conductive layer 36 is composed of Cu, but not limited thereto.

Figure 2:
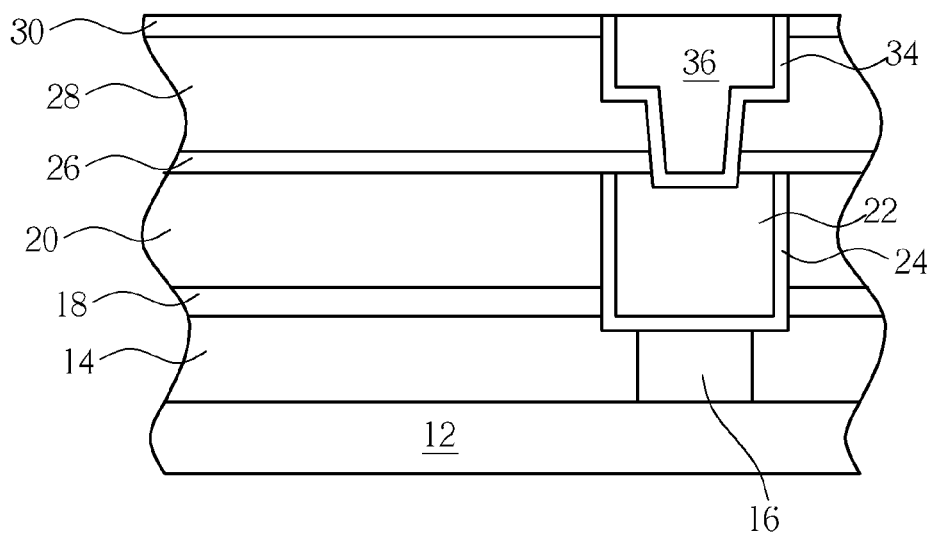

Next, as shown in FIG. 2, a planarizing process, such as a chemical mechanical polishing (CMP) process is conducted to remove part of the conductive layer 36, all of the barrier layer 34 on the ULK dielectric layer 28, and all of the metal layer 32 to expose the top surface of the hard mask 30, so that the top surface of the hard mask 30 is preferably even with the top surface of the conductive layer 36.

Figure 3:
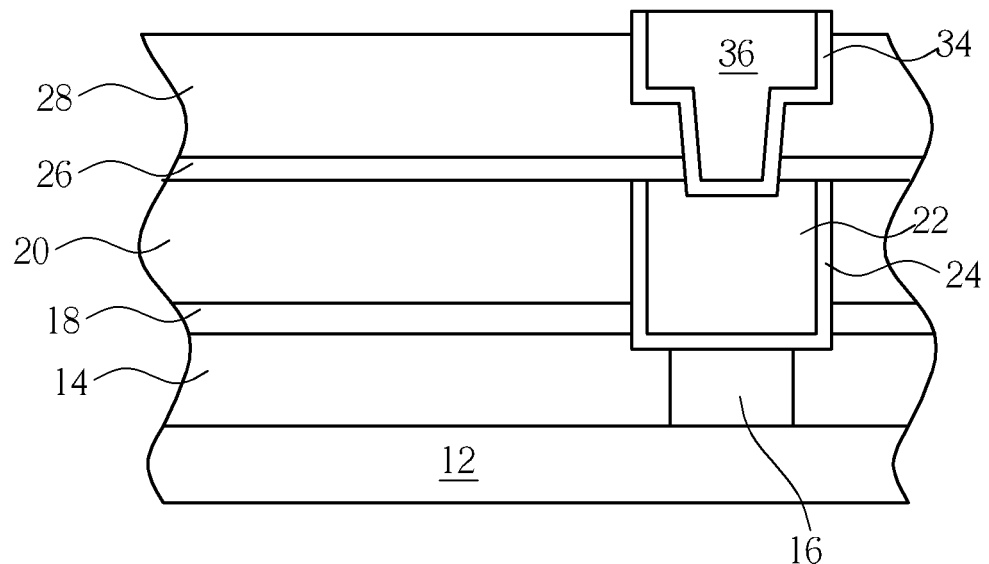

Next, as shown in FIG. 3, an etching back process is conducted to fully remove the hard mask 30 for exposing the ULK dielectric layer 28 underneath so that while part of the conductive layer 36 is embedded in the ULK dielectric layer 28, the top surface of the ULK dielectric layer 28 is lower than the top surface of the conductive layer 36. Preferably, by using an additional etching back process to remove the hard mask 30 separately before exposing the ULK dielectric layer 28, the present invention could reduce the damage done to ULK dielectric layer 28 if both the metal layer 32 and hard mask 30 were planarized by CMP process to expose the ULK dielectric layer 28 directly.

Figure 4:
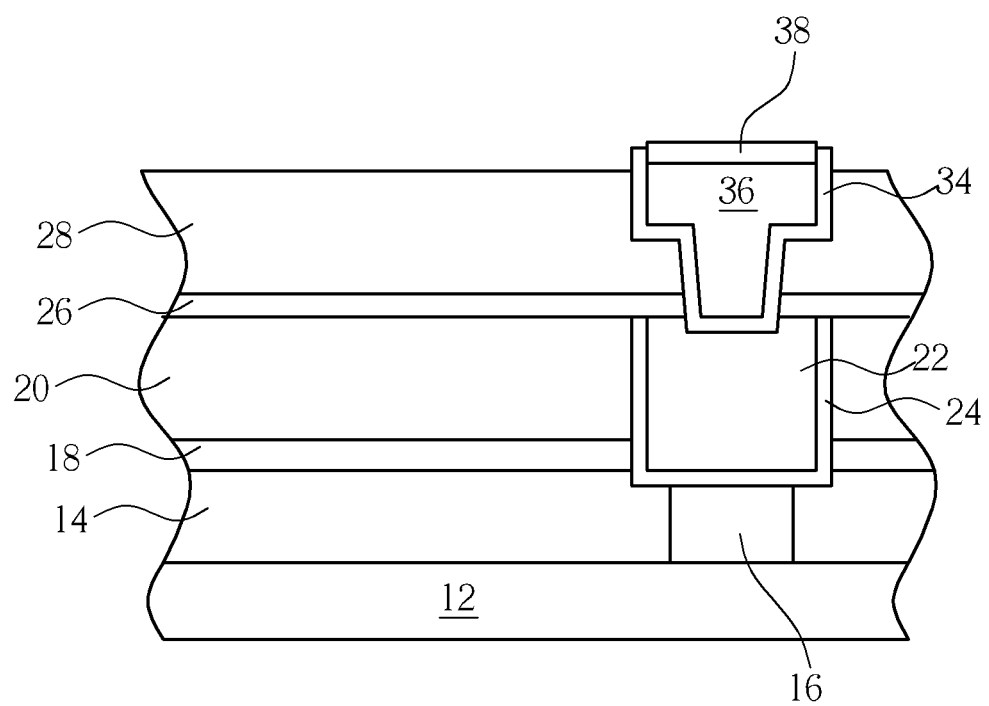
Figure 5:
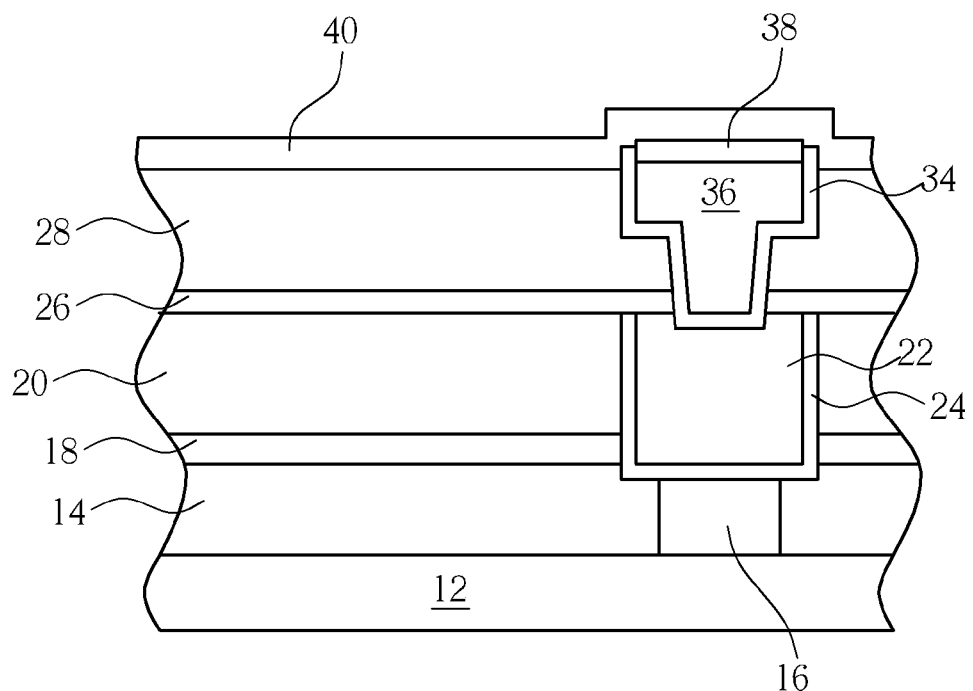

Next, as shown in FIG. 4, a metal layer 38 is formed on the conductive layer 36 after removing the hard mask 30. In this embodiment, metal layer 38 is composed of CuMn, CoW, Co, or CoWP Next, as shown in FIG. 5, a cap layer 40 is formed on the ULK dielectric layer 28 and the metal layer 38, in which the cap layer 40 could be composed of SiN, SiON, SiC, SiCON, SiCO, or SiCN. The thickness of the cap layer 40 is preferably between 100-300 Angstroms. From a structural view, the cap layer 40 is formed on the conductive layer 36 and metal layer 38 while contacting the ULK dielectric layer 28 directly, in which the top surface of the cap layer 40 on the ULK dielectric layer 28 is higher than the top surface of the conductive layer 36 and also higher than the top surface of the metal layer 38, or the top surface of the portion of the cap layer 40 directly contacting the ULK layer 28 is higher than the top surface of the conductive layer 36. This completes the fabrication of a semiconductor device according to a preferred embodiment of the present invention.

Figure 6:
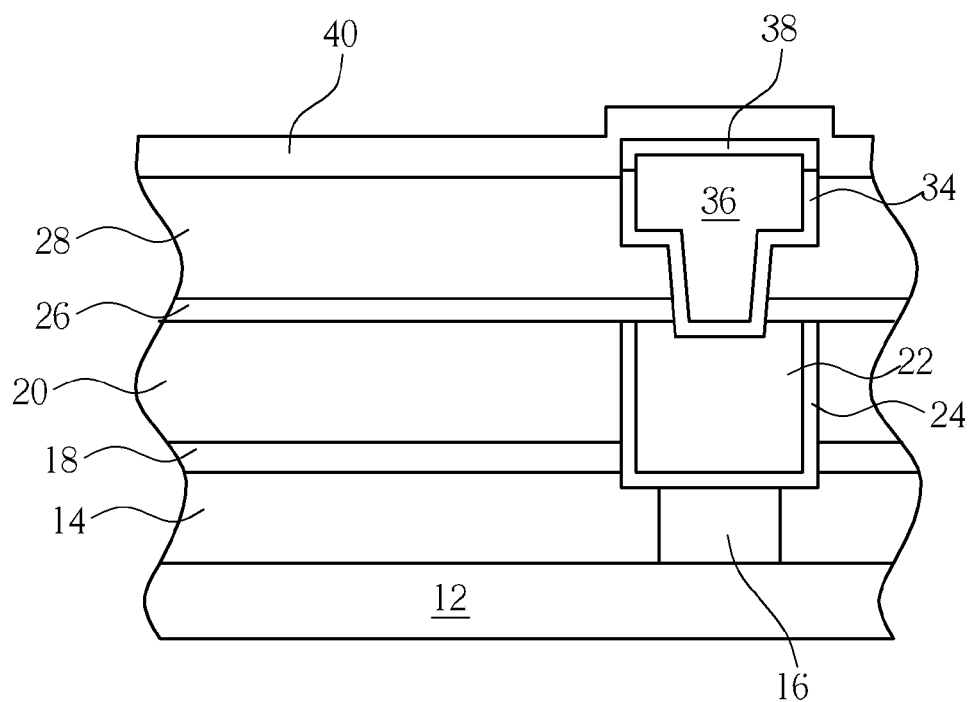
FIG. 6, which illustrates another approach for fabricating semiconductor device according to an embodiment of the present invention.

Referring to FIG. 6, which illustrates another approach for fabricating semiconductor device according to an embodiment of the present invention. As shown in FIG. 6, instead of removing the hard mask 30 without damaging the barrier layer 34 as revealed in FIG. 3, it would be desirable to remove the hard mask 30 and part of the barrier layer 34 simultaneously while the hard mask 30 is fully removed by a dry etching process. Nevertheless, it should be noted that while part of barrier layer 34 is removed along with the hard mask 30, the tip of the barrier layer 34 would not be even with the top surface of the ULK dielectric layer 28. Instead, the tip of the barrier layer 34 would be slightly above the top surface of the ULK dielectric layer.

As the hard mask 30 and part of the barrier layer 34 are removed, the ULK dielectric layer 28 and sidewalls of the conductive layer 36 are exposed simultaneously. Next, a metal layer 38 could be deposited and since the top surface and sidewalls of the conductive layer 36 are both exposed at this stage, the metal layer 38 is preferably formed to cover the top surface and sidewalls of the conductive layer 36. Consequently, a reversed U-shaped metal layer 38 would be formed on the conductive layer 36 and in this instance, the top surface of the ULK dielectric layer 28 would be lower than the top of the barrier layer 34 and bottom of the metal layer 38. A cap layer 40 could be formed on the ULK dielectric layer 28 and the metal layer 38 thereafter. Similar to the aforementioned embodiment, the metal layer 38 could be composed of CuMn, CoW, Co, or CoWP, and the cap layer 40 could be composed of SiN, SiON, SiC, or SiCN, but not limited thereto.

Figure 7:
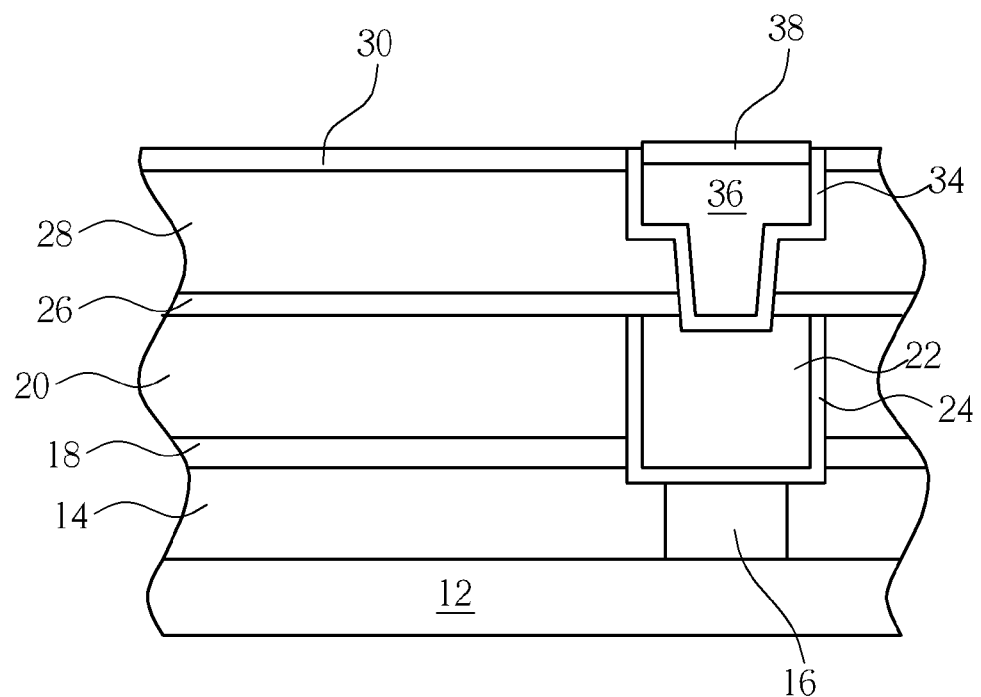
FIGS. 7-8 illustrate another approach for fabricating semiconductor device according to an embodiment of the present invention.
Figure 8:
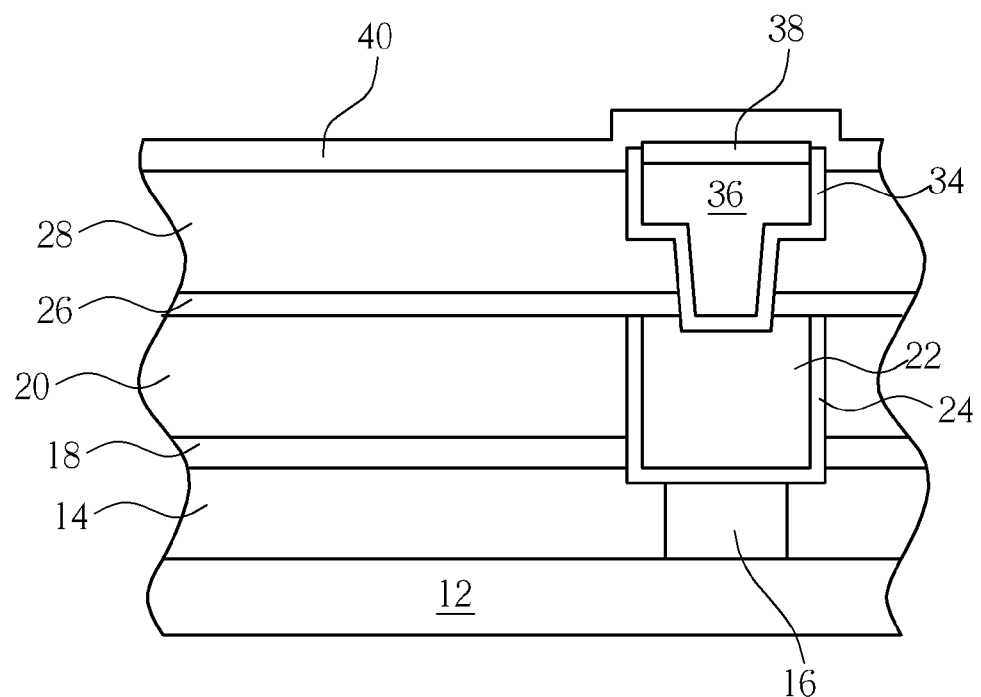

Referring to FIGS. 7-8, FIGS. 7-8 illustrate another approach for fabricating semiconductor device according to an embodiment of the present invention. As shown in FIG. 7, instead of removing the hard mask 30 completely before forming the metal layer 38 as disclosed in FIGS. 3-4, it would also be desirable to fully remove the hard mask 30 after the metal layer 38 is formed. For instance, after forming the hard mask 30 as shown in FIG. 2, a metal layer 38 could be formed atop the conductive layer 36 while the hard mask 30 is still on the ULK dielectric layer 28, as shown in FIG. 7. Next, as shown in FIG. 8, the hard mask 30 is then removed through an etching back process to expose the ULK dielectric layer 28 and a cap layer 40 is formed on the ULK dielectric layer 28 and the metal layer 38.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   an ULK dielectric layer on the substrate;
   a conductive layer embedded in the ULK dielectric layer, wherein a top surface of the ULK dielectric layer is lower than a top surface of the conductive layer;
   a barrier layer between the conductive layer and the ULK dielectric layer;
   a metal layer on the conductive layer, wherein an uppermost surface of the barrier layer is lower than a top surface of the metal layer; and
   a cap layer on the conductive layer while contacting the ULK dielectric layer directly, wherein a top surface of the cap layer on the ULK dielectric layer is higher than the top surface of the metal layer and lower than the top surface of the cap layer on the metal layer, a top surface of the barrier layer protruding above the ULK dielectric layer is lower than a top surface of the cap layer on the ULK dielectric layer while a bottom surface of the cap layer on the ULK dielectric layer is lower than a bottom surface of the metal layer, and an overall thickness of the cap layer on the ULK dielectric layer is equal to an overall thickness of the cap layer on the metal layer.

2. The semiconductor device of claim 1, wherein the metal layer comprises CuMn, CoW, Co, or CoWP.

3. The semiconductor device of claim 1, wherein the conductive layer comprises copper.

4. The semiconductor device of claim 1, further comprising:
   the metal layer on the top surface and sidewalls of the conductive layer;
   the barrier layer between the conductive layer and the ULK dielectric layer and contacting the metal layer; and the cap layer on the ULK dielectric layer and the metal layer.

5. The semiconductor device of claim 4, wherein the metal layer comprises CuMn, CoW, Co, or CoWP.

6. The semiconductor device of claim 4, wherein the top surface of the ULK dielectric layer is lower than a top of the barrier layer and a bottom of the metal layer.

7. The semiconductor device of claim 1, wherein the cap layer comprises SiCN, SiCON, or SiCO.

8. A semiconductor device, comprising:
a substrate;
an ULK dielectric layer on the substrate;
a conductive layer embedded in the ULK dielectric layer, wherein a top surface of the ULK dielectric layer is lower than a top surface of the conductive layer;
a metal layer on and contacting the top surface and sidewalls of the conductive layer, wherein the metal layer comprises a reverse U-shape having a horizontal portion and two vertical portions and a bottom surface of the two vertical portions is higher than a top surface of the ULK dielectric layer;
a barrier layer between the conductive layer and the ULK dielectric layer and contacting the metal layer, wherein a bottom surface of the two vertical portions of the metal layer completely covering an uppermost surface of the barrier layer; and
a cap layer on the conductive layer while contacting the ULK dielectric layer directly, wherein a top surface of the cap layer on the ULK dielectric layer is higher than a top surface of the metal layer and lower than the top surface of the cap layer on the metal layer.

9. The semiconductor device of claim 8, wherein the metal layer comprises CuMn, CoW, Co, or CoWP.

10. The semiconductor device of claim 8, wherein the conductive layer comprises copper.

11. The semiconductor device of claim 8, wherein the top surface of the ULK dielectric layer is lower than a top of the barrier layer and a bottom of the metal layer.

12. The semiconductor device of claim 8, wherein the cap layer comprises SiCN, SiCON, or SiCO.

13. The semiconductor device of claim 8, wherein two sidewalls of each of the two vertical portions are aligned with two sidewalls of the barrier layer.

14. The semiconductor device of claim 8, wherein the cap layer contacts the horizontal portion and the two vertical portions directly.

* * * * *